(12) United States Patent
Lin et al.

(10) Patent No.: US 8,437,441 B2
(45) Date of Patent: May 7, 2013

(54) PHASE LOCKED LOOP CAPABLE OF FAST LOCKING

(75) Inventors: Tsung-Hsien Lin, Taipei (TW); Wei-Hao Chiu, Taipei (TW); Yu-Hsiang Huang, Taipei (TW)

(73) Assignee: National Taiwan University, Taipei (TW)

( * ) Notice: Subject to any disclaimer, the term of this patent is extended or adjusted under 35 U.S.C. 154(b) by 898 days.

(21) Appl. No.: 12/506,023

(22) Filed: Jul. 20, 2009

(65) Prior Publication Data

US 2010/0183109 A1 Jul. 22, 2010

(30) Foreign Application Priority Data

Jan. 21, 2009 (TW) .............................. 98102236 A (51) Int. Cl.
*H03D 3/24* (2006.01)
(52) U.S. Cl.
USPC ........... 375/376; 375/226; 375/354; 375/371; 375/373; 375/374; 375/375; 455/260; 455/502; 455/516; 327/141; 327/147; 327/156; 370/516; 329/360
(58) Field of Classification Search .................. 375/226, 375/354, 371, 373, 374, 375, 376; 455/260, 455/502, 516; 370/516; 327/141, 147, 156; 329/360
See application file for complete search history.

(56) References Cited

U.S. PATENT DOCUMENTS 7,190,236 B2 * 3/2007 Lee et al. .................. 331/117 R
7,245,191 B2 * 7/2007 Sanders ........................ 331/179

* cited by examiner

*Primary Examiner* — Leon Flores
(74) *Attorney, Agent, or Firm* — Occhiuti Rohlicek & Tsao LLP (57) ABSTRACT

A phase locked loop includes a voltage controlled oscillator operable to generate an output signal corresponding to a reference signal in response to a control voltage signal outputted by a filter in response to a current signal, and a variable frequency divider operable to perform frequency division on the output signal using a variable divisor so as to generate a divided feedback signal. A charge pump outputs the current signal in response to a phase detecting output from a phase/frequency detector indicating phases of the divided feedback signal and the reference signal. A phase error comparator outputs, in accordance with the phase detecting output, a digital output indicating whether the divided feedback signal lags or leads the reference signal and further indicating a phase difference between the divided feedback signal and the reference signal. The variable frequency divider determines a value of the variable divisor in accordance with the digital output to reduce the phase difference between the divided feedback signal and the reference signal.

14 Claims, 10 Drawing Sheets

PHASE LOCKED LOOP CAPABLE OF FAST LOCKING

CROSS-REFERENCE TO RELATED APPLICATION

This application claims priority of Taiwanese Application No. 098102236, filed on Jan. 21, 2009.

BACKGROUND OF THE INVENTION

1. Field of the Invention

The invention relates to a phase locked loop, more particularly to a phase locked loop capable of dynamic phase compensation during frequency locking.

2. Description of the Related Art

Figure 1:
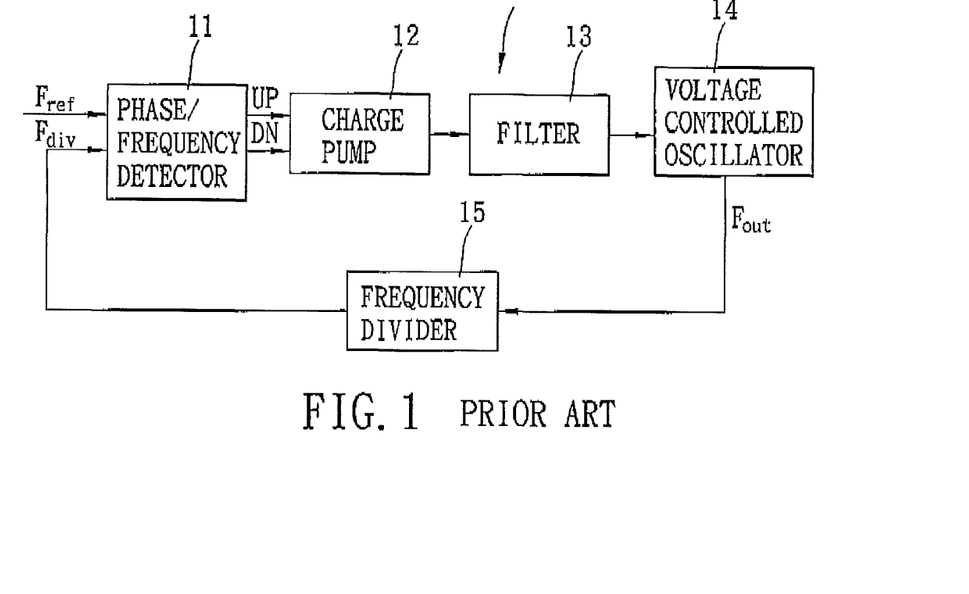
FIG. 1 is a schematic circuit block diagram of a conventional phase locked loop.

Phase locked loops are commonly used in a wireless communication system requiring frequencies with high accuracy FIG. 1 illustrates a conventional phase locked loop 1 that includes a phase/frequency detector 11, a charge pump 12, a filter 13, a voltage controlled oscillator 15, and a frequency divider 15 connected in a feedback loop.

The phase/frequency detector 11 detects a reference signal ($F_{ref}$), and a divided feedback signal ($F_{div}$) generated by the frequency divider 15 through frequency division on an output signal ($F_{out}$) from the voltage controlled oscillator 14, and outputs a phase detecting output having a first pulse signal (UP) indicating a phase of the reference signal ($F_{ref}$), and a second pulse signal (DN) indicating a phase of the divided feedback signal ($F_{div}$). The charge pump 12 outputs a current signal to the filter 13 in response to the first and second pulse signals (UP, DN). The filter 13 outputs a control voltage signal in response to the current signal from the charge pump 12. The voltage controlled oscillator 14 generates the output signal ($F_{out}$) corresponding to the reference signal ($F_{ref}$) in response to the control voltage signal from the filter 13. For the conventional phase locked loop 1, phase difference between the reference signal ($F_{ref}$) and the divided feedback signal ($F_{div}$) is compensated using a known frequency negative feedback manner until the reference signal ($F_{ref}$) and the divided feedback signal ($F_{div}$) are in-phase.

To meet high quality requirements of a communication system, the conventional phase locked loop 1 must be capable of fast locking and suppressing noise. However, in the design of the conventional phase locked loop 1, there is a trade-off between fast locking and noise suppression capability. Because, for high data transmission capability, the conventional phase locked loop 1 has to have a large bandwidth sufficient to speed up frequency locking. However, due to loop characteristics, low-frequency noise from the phase/frequency detector 11, the charge pump 12, the filter 13 and the frequency divider 15 must be effectively suppressed using a smaller bandwidth. Therefore, it becomes a very critical issue to develop a phase locked loop capable of fast locking using a narrow bandwidth.

Figure 2:
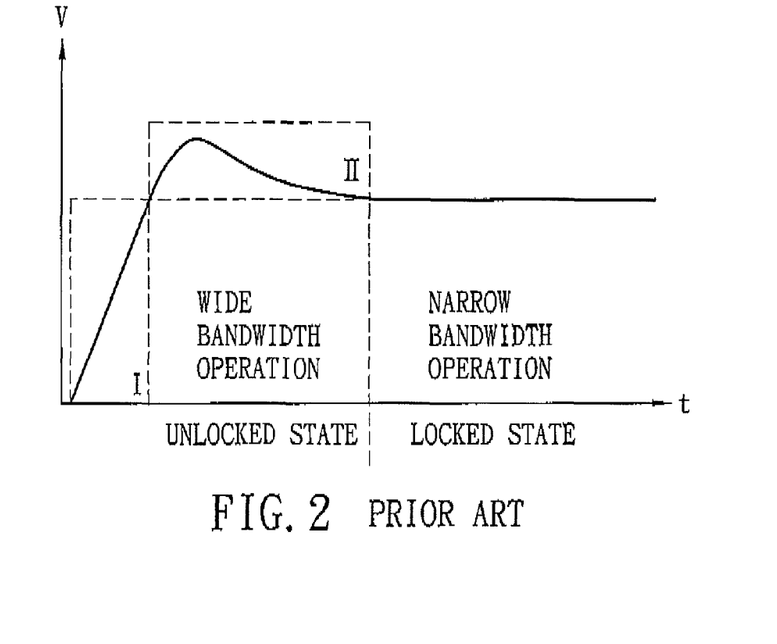
FIG. 2 is a plot illustrating a control voltage signal for a voltage controlled oscillator of another conventional phase locked loop using bandwidth switching.
Figure 3:
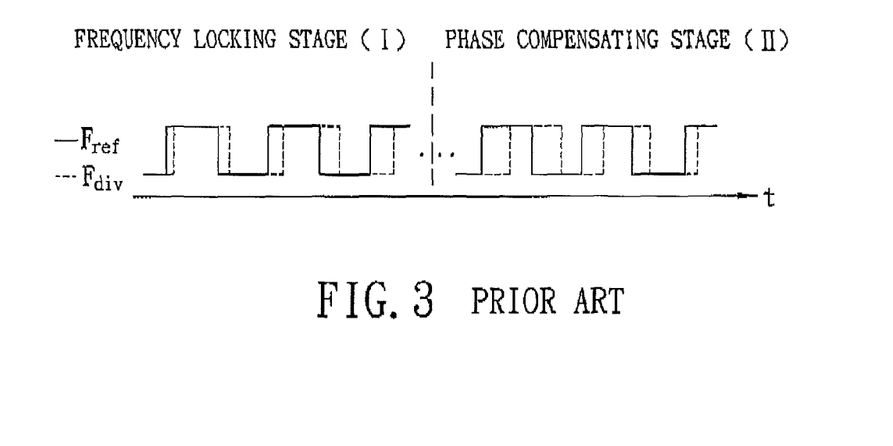
FIG. 3 is a diagram illustrating how a phase difference between a reference signal ($F_{ref}$) and a divided feedback signal ($F_{div}$) for the conventional phase locked loop using bandwidth switching varies during an unlocked state.

To solve the foregoing problem, another conventional phase locked loop (not shown) using a known bandwidth switching manner has been proposed. FIG. 2 illustrates a control voltage signal for a voltage controlled oscillator of the conventional phase locked loop using frequency switching, and indicates that the phase locked loop is operable between an unlocked state, where wide bandwidth operation is performed to speed up frequency locking, and a locked state, where narrow bandwidth operation is performed to suppress noises. The unlocked state contains a frequency locking stage (I) and a phase compensating stage (II). As shown in FIG. 3, since a phase difference between a reference signal (Fret) and a divided feedback signal ($F_{div}$) gradually increases during the frequency locking stage (I), it takes a longer time period to compensate the phase difference between the reference signal ($F_{ref}$) and the divided feedback signal ($F_{div}$) during the phase compensating stage (II), thereby resulting in a longer locking time period. As a result, the conventional phase locked loop using frequency switching cannot achieve fast locking.

SUMMARY OF THE INVENTION

Therefore, an object of the present invention is to provide a phase locked loop that is capable of dynamic phase compensation during frequency locking and that has a fast-locking capability.

According to the present invention, a phase locked loop comprises:

a voltage controlled oscillator operable so as to generate an output signal corresponding to a reference signal in response to a control voltage signal received thereby;

a variable frequency divider coupled to the voltage controlled oscillator for receiving the output signal therefrom and operable to perform frequency division on the output signal using a variable divisor so as to generate a divided feedback signal;

a phase/frequency detector coupled to the variable frequency divider, detecting the divided feedback signal from the variable frequency divider and the reference signal, and outputting a phase detecting output indicating phases of the divided feedback signal and the reference signal;

a charge pump coupled to the phase/frequency detector for receiving the phase detecting output therefrom, and outputting a current signal in response to the phase detecting output received thereby;

a filter coupled between the charge pump and the voltage controlled oscillator, receiving the current signal from the charge pump, and outputting the control voltage signal in response to the current signal received thereby; and a phase error comparator coupled to the phase/frequency detector and the variable frequency divider, receiving the phase detecting output from the phase/frequency detector, and outputting a digital output in accordance with the phase detecting output received thereby, the digital output indicating whether the divided feedback signal lags or leads the reference signal, and further indicating a phase difference between the divided feedback signal and the reference signal.

The variable frequency divider receives the digital output from said phase error comparator, and determines a value of the variable divisor in accordance with the digital output received thereby so that the phase difference between the divided feedback signal and the reference signal is reduced.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Figure 4:
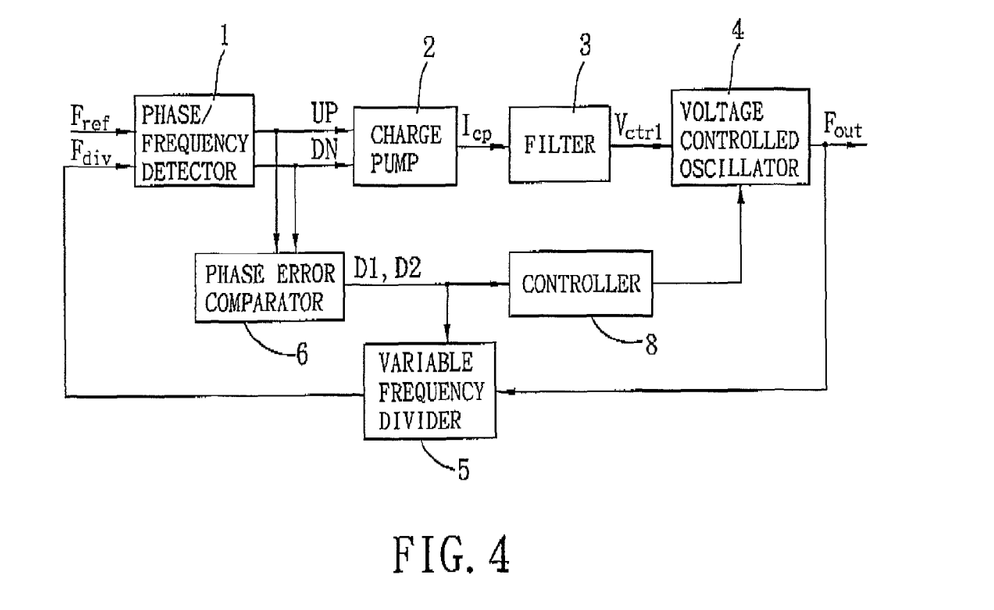
FIG. 4 is a schematic circuit block diagram illustrating the first preferred embodiment of a phase locked loop according to the present invention.

Referring to FIG. 4, the first preferred embodiment of a phase locked loop according to the present invention is shown to include a phase/frequency detector 1, a charge pump 2, a filter 3, a voltage controlled oscillator 4, a variable frequency divider 5, and a phase error comparator 6.

The voltage controller oscillator 4 is operable so as to generate an output signal ($F_{out}$) corresponding to a reference signal ($F_{ref}$) in response to at least a control voltage signal ($V_{ctrl}$) received thereby.

The variable frequency divider 5 is coupled to the voltage controlled oscillator 4 for receiving the output signal ($F_{out}$) therefrom, and is operable to perform frequency division on the output signal ($F_{out}$) using a variable divisor so as to generate a divided feedback signal ($F_{div}$).

The phase/frequency detector 1 is coupled to the variable frequency divider 5, detects the divided feedback signal ($F_{div}$) from the variable frequency divider 5 and the reference signal ($F_{ref}$), and outputs a phase detecting output indicating phases of the divided feedback signal ($F_{div}$) and the reference signal ($F_{ref}$). In this embodiment, the phase detecting output includes a first pulse signal (UP) corresponding to the reference signal ($F_{ref}$), and a second pulse signal (ON) corresponding to the divided feedback signal ($F_{div}$) A phase difference between the first and second pulse signals (UP, DN) corresponds to a phase difference between the divided feedback signal ($F_{div}$) and the reference signal ($F_{ref}$).

The charge pump 2 is coupled to the phase/frequency detector 1 for receiving the phase detecting output therefrom, and outputs a current signal ($I_{cp}$) in response to the phase detecting output received thereby.

The filter 3 is coupled between the charge pump 2 and the voltage controlled oscillator 4, receives the current signal ($I_{cp}$) from the charge pump 2, and outputs the control voltage signal ($V_{ctrl}$) in response to the current signal ($I_{cp}$) received thereby.

Figure 5:
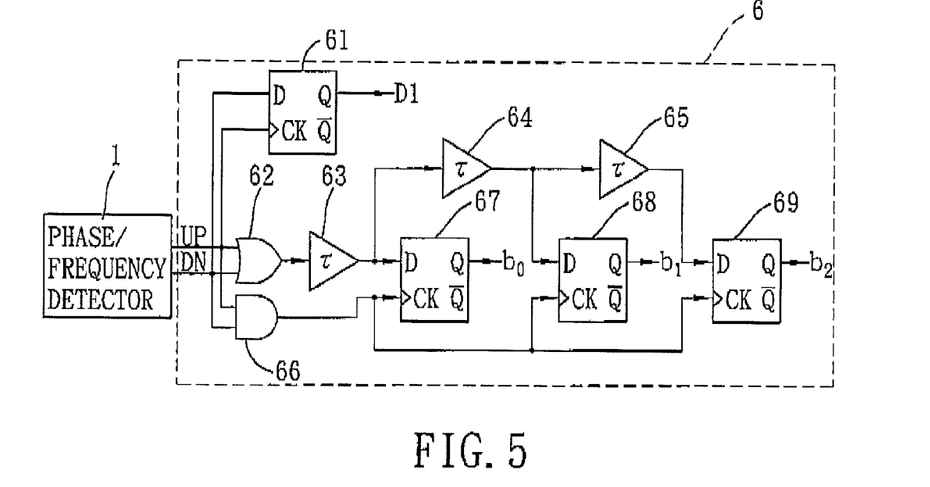
FIG. 5 is a schematic electrical circuit diagram illustrating a phase error comparator of the first preferred embodiment.
Figure 6:
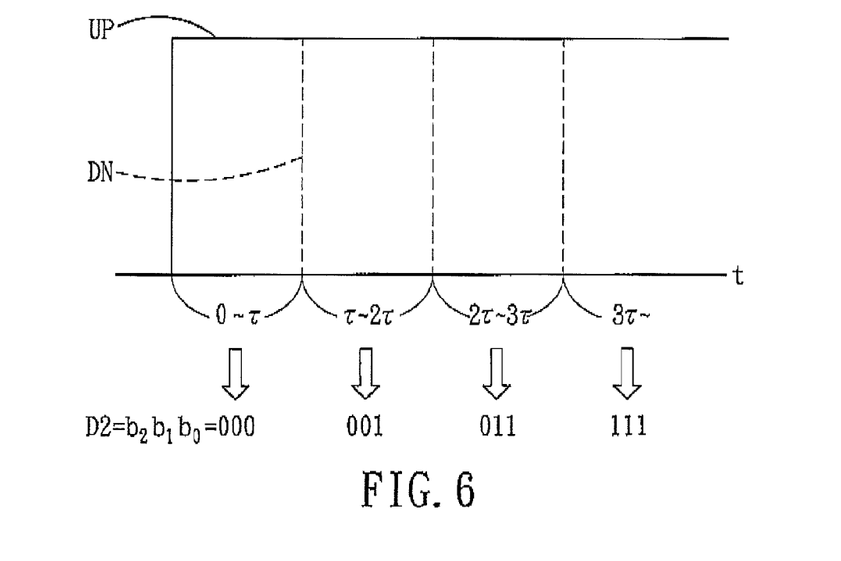
FIG. 6 is a diagram illustrating a first pulse signal (UP) and a second pulse signal (DN) outputted by a phase/frequency detector of the first preferred embodiment, wherein a phase difference between the first and second pulse signals (UP, DN) corresponds to a second signal (D2) of a digital output having a respective digital value.

The phase error comparator 6 is coupled to the phase/frequency detector 1 and the variable frequency divider 5, receives the phase detecting output from the phase/frequency detector 1, and outputs a digital output in accordance with the phase detecting output received thereby. The digital output indicates whether the divided feedback signal ($F_{div}$) lags or leads the reference signal ($F_{ref}$), and further indicates a phase difference between the divided feedback signal ($F_{div}$) and the reference signal ($F_{ref}$). In this embodiment, the digital output includes a first signal (D1) and a second signal (D2). The first signal (D1) indicates whether the divided feedback signal ($F_{div}$) lags or leads the reference signal ($F_{ref}$). The first signal (D1) has a low level, i.e., D1=0, when the divided feedback signal ($F_{div}$) lags the reference signal ($F_{ref}$), and a high level, i.e., D1=1, when the divided feedback signal ($F_{611}$) leads the reference signal ($F_{ref}$). The second signal (D2) indicates the phase difference between the divided feedback signal ($F_{div}$) and the reference signal ($F_{ref}$). The second signal (D2) is a multi-bit signal, such as a 3-bit signal, that has three bit components ($b_0$, $b_1$, $b_2$), i.e., D2=$b_2 b_1 b_0$. Referring further to FIG. 5, in this embodiment, the phase error comparator 6 includes a first D-type flip-flop 61, an OR gate 62, an AND gate 66, a series connection of three delay circuits 63, 64, 65, and three second D-type flip-flops 67, 68, 69. The first D-type flip-flop 61 has a clock input and a data input coupled to the phase/frequency detector 1 for receiving respectively the first and second pulse signals (UP, DN) therefrom, and a data output for outputting the first signal (D1) of the digital output. The OR gate 62 has two input ends coupled to the phase/frequency detector 1 for receiving respectively the first and second pulse signals (UP, ON) therefrom, and an output end. The AND gate 66 has two input ends coupled to the phase/frequency detector 1 for receiving respectively the first and second pulse signals (UP, DN) therefrom, and an output end. Each of the delay circuits 63, 64, 65 has an input and an output, and is capable of receiving an input signal through the input thereof and subsequently outputting the input signal received thereby through the output thereof after a predetermined time delay that is equal to τ in this embodiment. The delay circuit 63 is coupled to the output end of the OR gate 62. Each of the second D-type flip-flops 67, 68, 69 has a clock input coupled to the output end of the AND gate 66, a data input, and a data output. The data input of a $j^{th}$ one of the second D-type flip-flops 67, 68, 69 is coupled to the output of a $j^{th}$ one of the delay circuits 63, 64, 65, and the data output of the $j^{th}$ one of the second D-type flip-flops 67, 68, 69 outputs a $j^{th}$ one of the bit components (b0, b1, b2) of the second signal (D2) of the digital output, where $1 \leq j \leq 3$. That is, the data outputs of the second D-type flip-flops 67, 68, 69 output respectively the bit components (b0, b1, b2). In this case, referring to FIG. 6, when the phase difference between the divided feedback signal ($F_{div}$) and the reference signal ($F_{ref}$) is less than τ, each of the bit components ($b_0$, $b_1$, $b_2$) of the second signal (D2) of the digital output has a low level, i.e. D2=$b_2 b_1 b_0$=000. When the phase difference between the divided feedback signal ($F_{div}$) and the reference signal ($F_{ref}$) is within a range from τ to 2Σ, the bit component ($b_0$) of the second signal (D2) of the digital output has a high level and the bit components ($b_1$, $b_2$) have a low level, i.e., D2=$b_2 b_1 b_0$=001. When the phase difference between the divided feedback signal ($F_{div}$) and the reference signal ($F_{ref}$) is within a range from 2τ to 3τ, the bit components ($b_0$, $b_1$) of the second signal (D2) of the digital output have a high level and the bit component (b2) has a low level, i.e., D2=$b_2 b_1 b_0$=011. When the phase difference between the divided feedback signal ($F_{div}$) and the reference signal ($F_{ref}$) is greater than 3τ, each of the bit components ($b_0$, $b_1$, $b_2$) of the second signal (D2) of the digital output has a high level, i.e. D2=$b_2 b_1 b_0$=111.

It is noted that the delay circuits 63, 64, 65 have the same time delay in this embodiment. In other embodiments, the time delays of the delay circuits 63, 64, 65 could be configured to be different from each other.

The variable frequency divider 5 receives the digital output from the phase error comparator 6, and determines a value of the variable divisor in accordance with the digital output received thereby so that the phase difference between the divided feedback signal ($F_{div}$) and the reference signal ($F_{ref}$) is reduced. In this embodiment, when the digital output received by the variable frequency divider 5 indicates that the divided feedback signal ($F_{div}$) lags the reference signal ($F_{ref}$), i.e., D1=0, the variable frequency divider 5 is operable to decrease the value of the variable divisor. On the other hand, when the digital output received by the variable frequency divider 5 indicates that the divided feedback signal ($F_{div}$) leads the reference signal ($F_{ref}$), i.e., D1=1, the variable frequency divider 5 is operable to increase the value of the variable divisor. In this embodiment, the variable frequency divider 5 is a programmable frequency divider associated with an initial divisor value, for example, equal to N that is decreased or increased in accordance with the digital output received thereby.

Figure 7A:
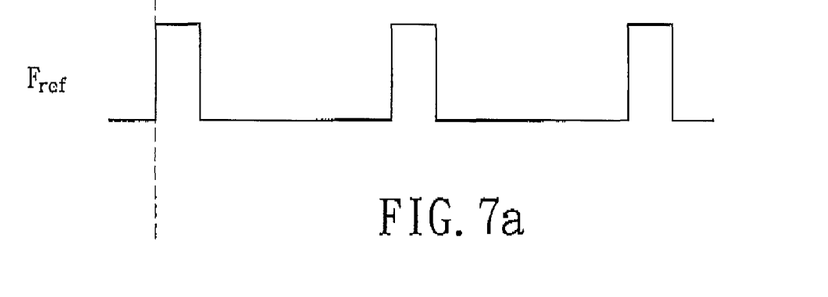
FIG. 7a is a timing diagram of a reference signal ($F_{ref}$)
Figure 7B:
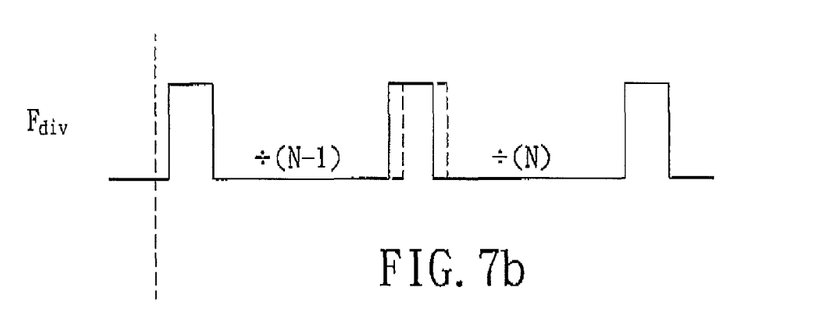
FIGS. 7b and 7c are timing diagrams illustrating phase compensation results of a divided feedback signal ($F_{div}$) having different phases through change of a value of a variable divisor used by a variable frequency divider in the first preferred embodiment.
Figure 7C:
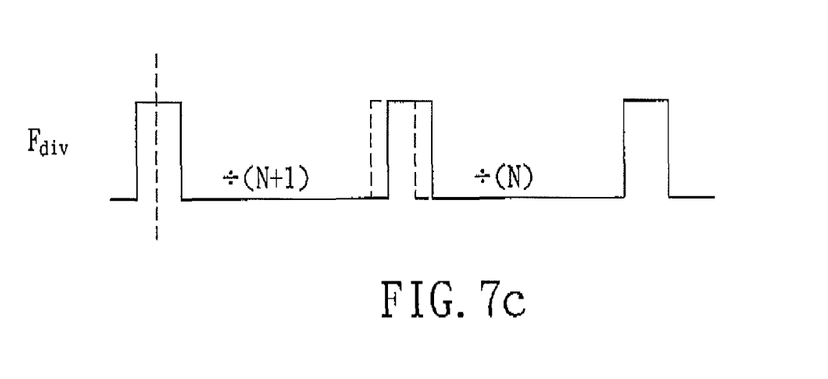

For example, as shown in FIGS. 7a and 7b, when the divided feedback signal ($F_{div}$) lags the reference signal ($F_{ref}$) while the phase difference between the divided feedback signal ($F_{div}$) and the reference signal ($F_{ref}$) is within a range from τ to 2τ, according to the digital output, i.e., D1=0 and D2=$b_2 b_1 b_0$=001, the variable frequency divider 5 is operable to decrease the value of the variable divisor by one such that the value of the variable divisor becomes N−1. Thereafter, since the phase difference between the divided feed back signal ($F_{div}$) and the reference signal ($F_{ref}$) is compensated, the divided feedback signal ($F_{div}$) and the reference signal ($F_{ref}$) become in-phase. As shown in FIGS. 7a and 7c, when the divided feedback signal ($F_{div}$) leads the reference signal ($F_{ref}$) while the phase difference between the divided feedback signal ($F_{div}$) and the reference signal ($F_{ref}$) is within the range from τ to 2τ, according to the digital output, i.e., D1=1 and D2=$b_2 b_1 b_0$=001, the variable frequency divider 5 is operable to increase the value of the variable divisor by one such that the value of the variable divisor becomes N+1. Thereafter, since the phase difference between the divided feedback signal ($F_{div}$) and the reference signal ($F_{ref}$) is compensated, the divided feedback signal ($F_{div}$) and the reference signal (Fret) become in-phase. Similarly, when D1=0/1 and D2=011/111, the variable frequency 5 is operable to decrease/increase the value of the variable divisor by two/ three.

In this embodiment, to speed up frequency locking, the phase locked loop further includes a controller 8 coupled to the phase error comparator 6 and the voltage controlled oscillator 4. The controller 8 receives the digital output from the phase error comparator 6, and outputs a control signal to the voltage controlled oscillator 4 in accordance with the digital output received thereby when the digital output indicates that the phase difference between the divided feedback signal ($F_{div}$) and the reference signal ($F_{ref}$) is greater than a predetermined phase difference, such as τ. Thus, the voltage controlled oscillator 4 outputs the output signal ($F_{out}$) in response to both the control voltage signal ($V_{ctrl}$) from the filter 3 and the control signal from the controller 8.

Figure 8:
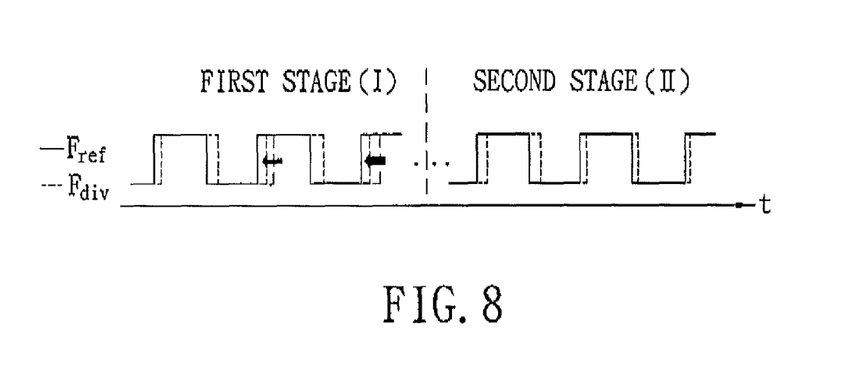
FIG. 8 is a diagram illustrating a phase compensation result of the divided feedback signal ($F_{div}$) in the first preferred embodiment during an unlocked state.
Figure 9:
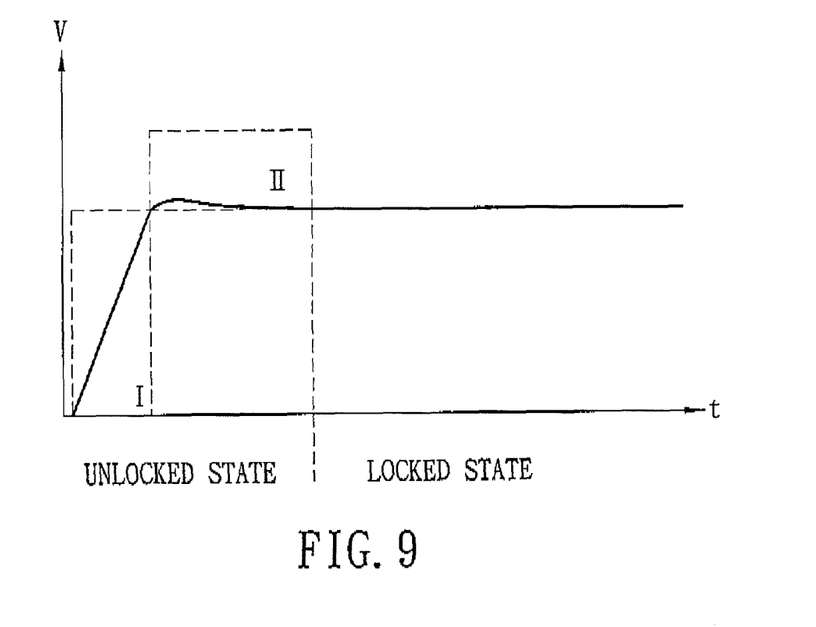
FIG. 9 is a plot illustrating a control voltage signal ($V_{ctrl}$) outputted by a filter of the first preferred embodiment.

In such a configuration, the phase locked loop is operable between an unlocked state and a locked state, wherein the unlocked state contains a first stage (I) and a second stage (II), as shown in FIG. 9. During the first stage (I), aside from achieving fast frequency locking, phase compensation is also performed. In other words, the phase difference between the divided feedback signal ($F_{div}$) and the reference signal ($F_{ref}$) is not increased during the first stage (I), as shown in FIG. 8. Thus, it takes a shorter amount of time to perform phase locking operation in the second stage (II). Therefore, fast locking can be attained.

Figure 10:
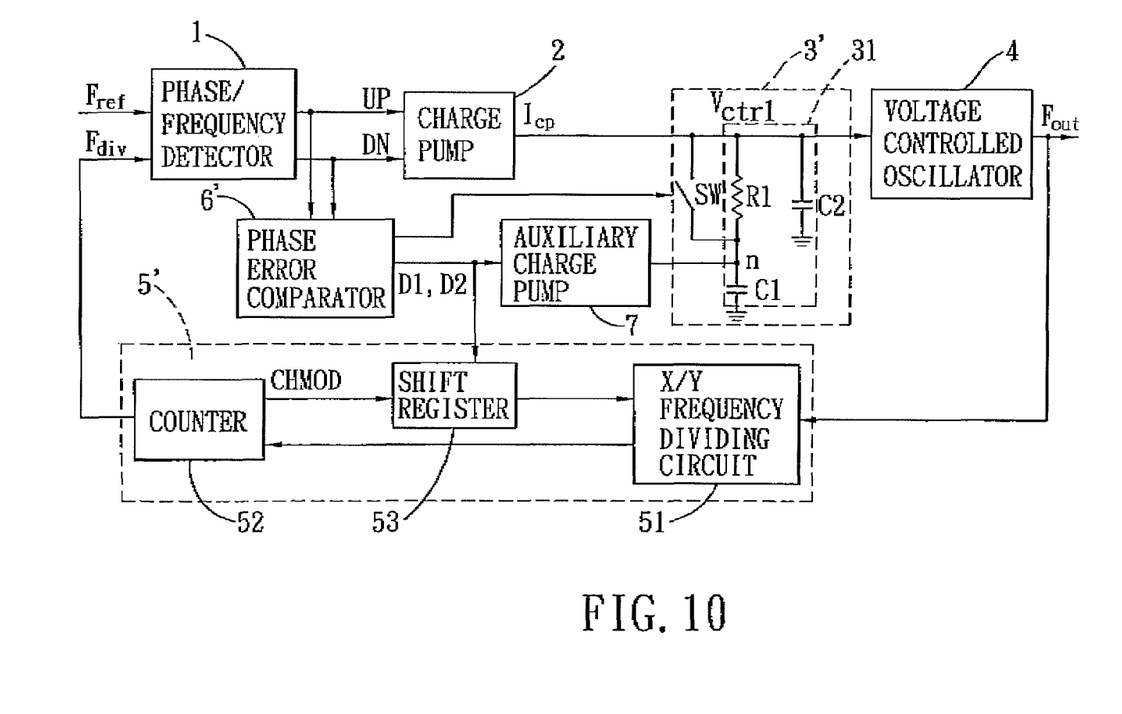
FIG. 10 is a schematic circuit block diagram illustrating the second preferred embodiment of a phase locked loop according to the present invention.

FIG. 10 illustrates the second preferred embodiment of a phase locked loop according to this invention, which is a modification of the first preferred embodiment.

In this embodiment, the variable frequency divider 5' is a multi-mode frequency divider that includes a X/Y frequency dividing circuit 51, a counter 52 and a shift register 53.

The X/Y frequency dividing circuit 51 performs frequency division on the output signal ($F_{out}$) by one of X and Y, where X and Y are equal to 4 and 5, respectively, in this embodiment.

The counter 52 is coupled to the X/Y frequency dividing circuit 51 for counting a number (P) of division operations of the X/Y frequency dividing circuit 51 that includes a number (S) of division operations by X and a number (P−S) of division operations by Y, and outputs a transition control signal (CHMOD) to the X/Y frequency dividing circuit 51 such that the X/Y frequency dividing circuit 51 operates based on the transition control signal (CHMOD). In this embodiment, when the transition control signal (CHMOD) has a low level, the X/Y frequency dividing circuit 51 performs division operation by X. When the transition control signal (CHMOD) has a high level, the X/Y frequency dividing circuit 51 performs division operation by Y.

The shift register 53 is coupled to the phase error comparator 6', the counter 52 and the X/Y frequency dividing circuit 51, receives the digital output from the phase error comparator 6', and is operable so as to shift the transition control signal (CHMOD) from the counter 52 in accordance with the digital output received thereby when the digital output indicates that the phase difference between the divided feedback signal ($F_{div}$) and the reference signal ($F_{ref}$) is greater than a predetermined phase difference, such as τ, such that the number (S) of division operations by X within the number (P) of division operations is adjusted according to the digital output.

Figure 11A:
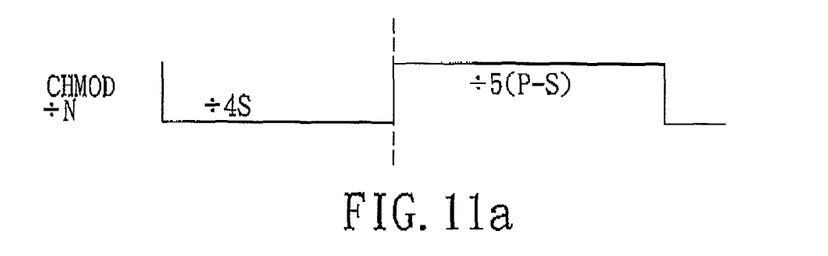
FIG. 11a is a timing diagram illustrating an example of a transition control signal (CHMOD) outputted by a counter of a variable frequency divider of the second preferred embodiment.
Figure 11B:
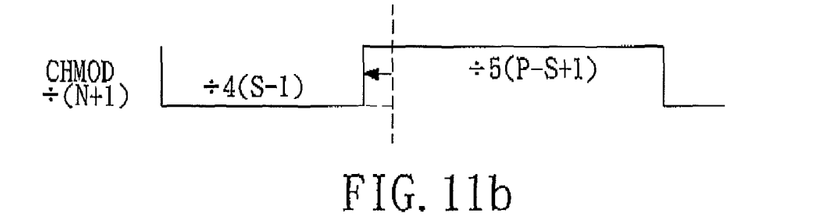
FIGS. 11b and 11c are timing diagrams illustrating different shift operations of the transition control signal (CHMOD) of FIG. 11a by a shift register of the variable frequency divider of the second preferred embodiment.
Figure 11C:
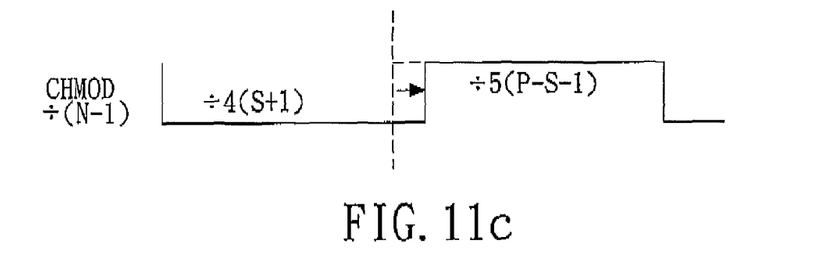

FIG. 11a illustrates an example of the transition control signal (CHMOD) outputted by the counter 52, wherein the X/Y frequency dividing circuit 51 performs a number (S) of division operations by 4 and a number (P−S) of division operations by 5 based on the transition control signal (CHMOD). In this example, the division operation of the variable frequency divider 5' corresponds to a value of the variable divisor equal to N. According to this example, when the divided feedback signal ($F_{div}$) leads the reference signal ($F_{ref}$) while the phase difference between the divided feedback signal ($F_{div}$) and the reference signal ($F_{ref}$) is greater than a, i.e., D1=1 and $b_0$=1, the shift register 53 is operable to forward shift a transition point of the transition control signal (CHMOD) of FIG. 11a from a low level to a high level by one operating cycle, as shown in FIG. 11b, such that the X/Y frequency dividing circuit 51 performs a number (S−1) of division operations by 4 and a number (P−S+1) of division operations by 5 that correspond to the value of the variable divisor equal to N+1. On the other hand, when the divided feedback signal ($F_{div}$) lags the reference signal ($F_{ref}$) while the phase difference between the divided feedback signal ($F_{div}$) and the reference signal ($F_{ref}$) is greater than a, i.e., D1=0 and $b_0$=1, the shift register 53 is operable to backward shift the transition point of the transition control signal (CHMOD) of FIG. 11a by one operating cycle, as shown in FIG. 11c, such that the X/Y frequency dividing circuit 51 performs a number (S+1) of division operations by 4 and a number (P−S−1) of division operations by 5 that correspond to the value of the variable divisor equal to N−1.

Figure 12:
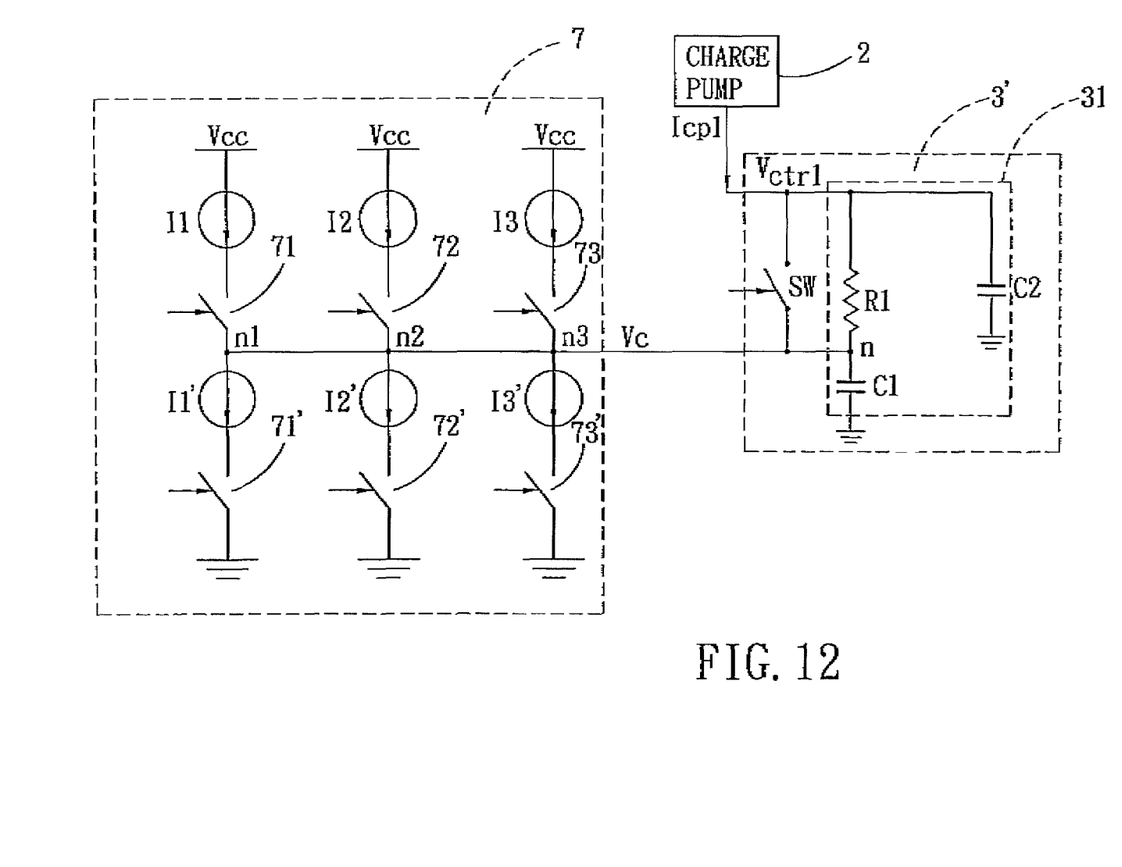
FIG. 12 is a schematic electrical circuit diagram illustrating an auxiliary charge pump and a filter of the second preferred embodiment.

In this embodiment, to speed up frequency locking, the filter 3' includes a filtering circuit 31 and a bypass switch (SW). The filtering circuit 31 includes a series connection of a resistor (R1) and a first capacitor (C1) coupled to the charge pump 2 and the voltage controlled oscillator 4, and a second capacitor (C2) coupled in parallel to the series connection of the resistor (R1) and the first capacitor (C1). The bypass switch (SW) is coupled across the resistor (R1) and has a control end for receiving a control signal such that the bypass switch (SW) is triggered to conduct in response to the control signal received thereby so as to bypass the resistor (R1), thereby speeding up output of the control voltage signal ($V_{ctrl}$).

The phase error comparator 6' outputs the control signal to the control end of the bypass switch (SW) upon detecting that the phase difference between the divided feedback signal ($F_{div}$) and the reference signal ($F_{ref}$) is greater than a predetermined phase difference, such as τ.

Furthermore, the phase locked loop further includes an auxiliary charge pump 7 coupled between the phase error comparator 6' and a common node (n) of the resistor (R1) and the first capacitor (C1) of the filter 3'. The auxiliary charge pump 7 receives the digital output from the phase error comparator 6', and outputs an auxiliary current signal to the filter 3' in accordance with the digital output received thereby. In this case, the filter 3' outputs the control voltage signal ($V_{ctrl}$) in response to the current signal ($I_{cp}$) from the charge pump 2 and the auxiliary current signal from the auxiliary charge pump 7, thereby speeding up frequency locking. It is noted that, in other embodiments, the auxiliary charge pump 7 can be omitted.

The auxiliary charge pump 7 supplies a charging current that serves as the auxiliary current signal to the first capacitor (C1) when the digital output indicates that the divided feedback signal ($F_{div}$) lags the reference signal ($F_{ref}$), and provides a discharge path for permitting discharge of the first capacitor (C1) of the filter 3' with ad is charge current that serves as the auxiliary current signal therethrough when the divided feedback signal ($F_{div}$) leads the reference signal ($F_{ref}$). The auxiliary current signal has a current value corresponding to the phase difference between the divided feedback signal ($F_{div}$) and the reference signal ($F_{ref}$). In this embodiment, referring further to FIG. 12, the auxiliary charge pump 7 includes a first series connection of a current source (I1), a switch 71, a current source (I1') and a switch 71', a second series connection of a current source (I2), a switch 72, a current source (I2') and a switch 72', and a third series connection of a current source (I3), a switch 73, a current source (I3') and a switch 73'. The first, second and third series connections are connected in parallel between a voltage source (Vcc) and ground. A common node (n1) between the switch 71 and the current source (I1'), a common node (n2) between the switch 72 and the current source (I2'), and a common node (n3) between the switch 73 and the current source (I3') are coupled to the common node (n). The switches (71, 71', 72, 72', 73, 73') operate based on the digital output from the phase error comparator 6'. When the divided feedback signal ($F_{div}$) lags the reference signal ($F_{ref}$), i.e., D1=0, the switches 71', 72', 73' do not conduct and the switches 71, 72, 73 are operable based on the bit components ($b_0$, $b_1$, $b_2$) of the second signal (D2) of the digital output, respectively. As such, a current from at least one of the current sources (I1, I2, I3) constitutes the charging current to the first capacitor (C1) of the filter 3'. On the other hand, when the divided feed back signal ($F_{div}$) leads the reference signal ($F_{ref}$), i.e., D=1, the switches 71, 72, 73 do not conduct and the switches 71', 72', 73' are operable based on the bit components ($b_0$, $b_1$, $b_2$) of the second signal (D2) of the digital output, respectively. As such, a current from at least one of the current sources (I1', I2', I3') constitutes a discharge current from the first capacitor (C1) of the filter 3'. In this embodiment, the current sources (I1, I1', I2, I2', I3, I3') supply the same Current. In other embodiments, the current sources (I1, I1') supply the same current, the current sources (I2, I2') supply the same current, the current sources (I3, I3') supply the same current, and the currents supplied by the currents (I1, I2, I3) could be configured to be different from each.

In this embodiment, the phase locked loop can be fabricated in a 0.18 μm CMOS process. Excluding the filter 43', all circuit components can be implemented in an area equal to 1.3×1.224 mm².

Figure 13:
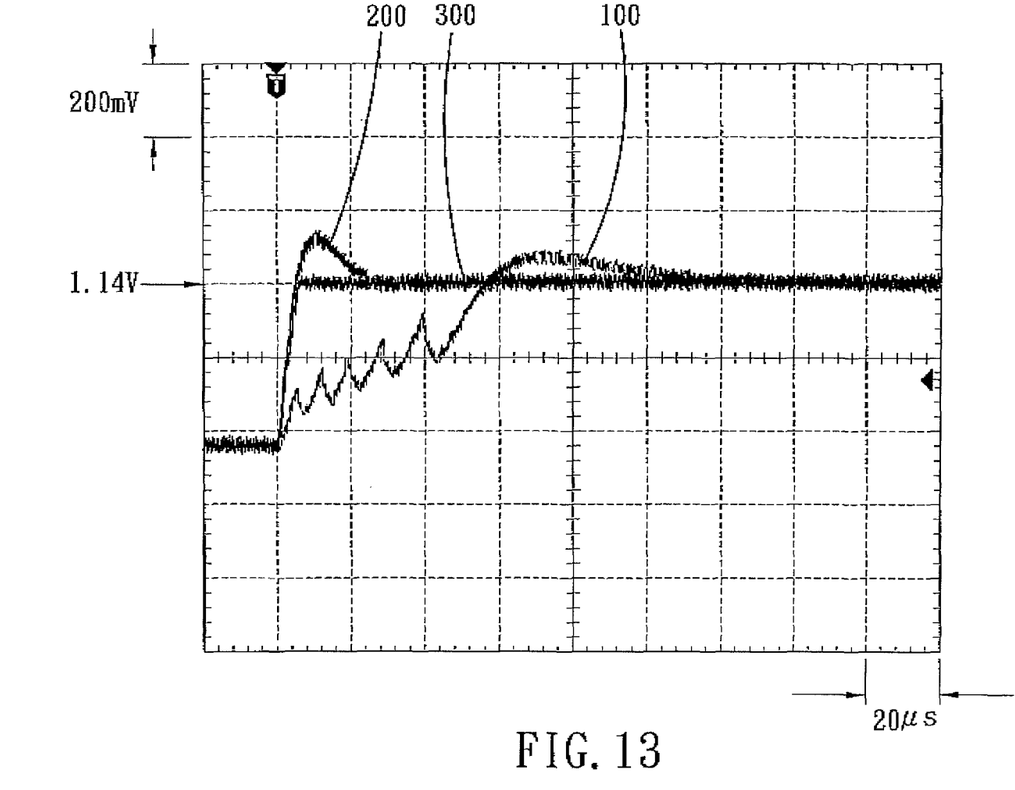
FIG. 13 illustrates experimental measurement results of the control voltage signal for indicating respectively the locking times of the conventional phase locked loop of FIG. 1, the conventional phase locked loop using bandwidth switching, and the second preferred embodiment.
Figure 14:
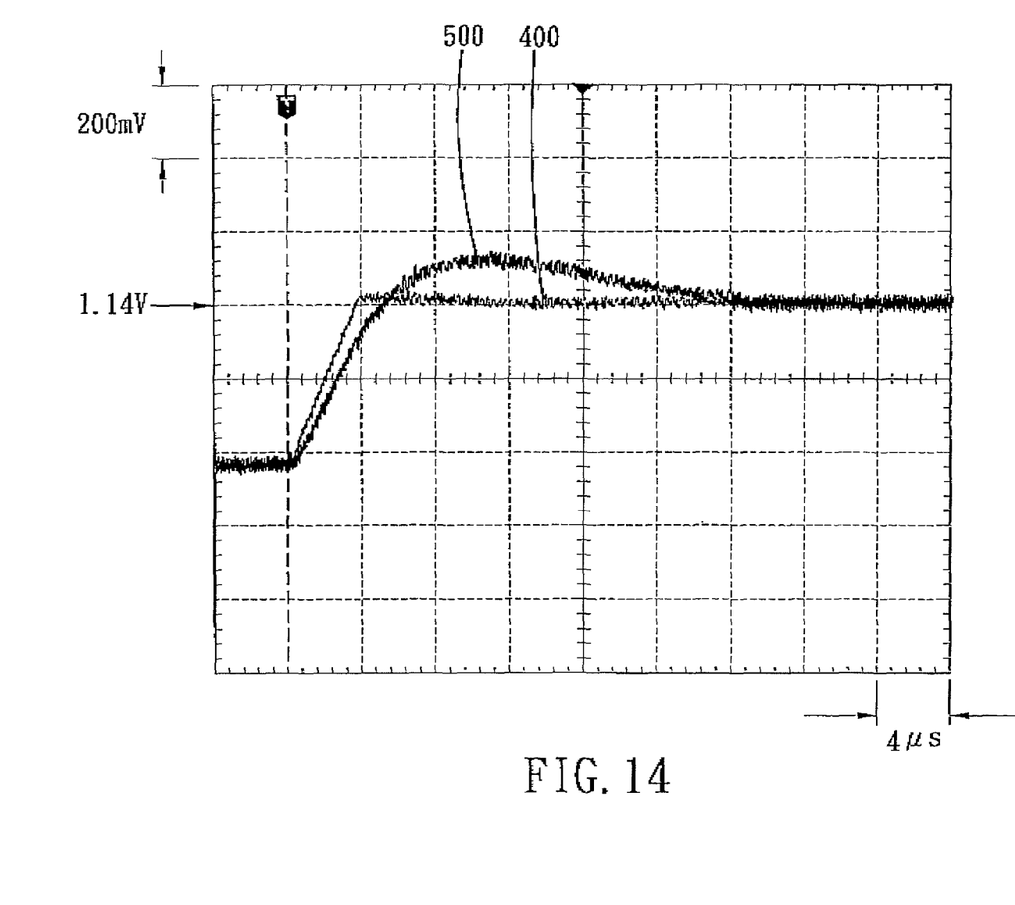
FIG. 14 illustrates experimental measurement results of the control voltage signal under a hopping frequency of 6×4.7 MHz for indicating the locking times of the conventional phase locked loop of FIG. 1 and the phase locked loop of the second preferred embodiment.

FIG. 13 illustrates experimental measurement results of the control voltage signal ($V_{ctrl}$) under a target frequency of 5 GHz and a bandwidth of 20 KHz, wherein curves 100, 200, 300 represent respectively the conventional phase locked loop 1 of FIG. 1, the conventional phase locked loop using bandwidth switching, and the phase locked loop of the second preferred embodiment. It can be seen from this figure that the locking time of the conventional phase locked loop 1 of FIG. 1 is about 130 μs, the locking time of the conventional phase locked loop using bandwidth switching is about 40 μs, and the locking time of the phase locked loop of the second preferred embodiment is about 10 μs. From the foregoing, it is evident that, the locking speed of the phase locked loop of the second preferred embodiment is about four times faster than that of the conventional phase locked loop using bandwidth switching FIG. 14 illustrates experimental measurement results of the control voltage signal ($V_{ctrl}$) under a reference frequency of 4.7 MHz and a hopping frequency of 6×4.7 MHz, wherein curves 400, 500 represent respectively the conventional phase locked loop using bandwidth switching, and the phase locked loop of the second preferred embodiment. From the measurement results of FIG. 14, the locking speed of the phase locked loop of the second preferred embodiment is much faster than that of the conventional phase locked loop using bandwidth switching.

In sum, due to configuration of the phase error comparator 6, 6' and the variable frequency divider 6, 6', the phase locked loop of the present invention is capable of performing phase compensation operation during frequency locking. Due to the presence of the controller 8, the auxiliary charge pump 7 and the bypass switch (SW), the phase locked loop of the present invention can speed up frequency locking. Therefore, fast locking can be achieved.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A phase locked loop comprising:
    a voltage controlled oscillator operable so as to generate an output signal corresponding to a reference signal in response to a control voltage signal received thereby;
    a variable frequency divider coupled to said voltage controlled oscillator for receiving the output signal therefrom and operable to perform frequency division on the output signal using a variable divisor so as to generate a divided feedback signal;
    a phase/frequency detector coupled to said variable frequency divider, detecting the divided feedback signal from said variable frequency divider and the reference signal, and outputting a phase detecting output indicating phases of the divided feedback signal and the reference signal;
    a charge pump coupled to said phase/frequency detector for receiving the phase detecting output therefrom, and outputting a current signal in response to the phase detecting output received thereby;
    a filter coupled between said charge pump and said voltage controlled oscillator, receiving the current signal from said charge pump, and outputting the control voltage signal in response to the current signal received thereby; and
    a phase error comparator coupled to said phase/frequency detector and said variable frequency divider, receiving the phase detecting output from said phase/frequency detector, and outputting a digital output in accordance with the phase detecting output received thereby, the digital output indicating whether the divided feedback signal lags or leads the reference signal, and further indicating a phase difference between the divided feedback signal and the reference signal;
    wherein said variable frequency divider receives the digital output from said phase error comparator, and determines a value of the variable divisor in accordance with the digital output received thereby so that the phase difference between the divided feedback signal and the reference signal is reduced.

2. The phase locked loop as claimed in claim 1, further comprising a controller coupled to said phase error comparator and said voltage controlled oscillator, receiving the digital output from said phase error comparator, and outputting a control signal to said voltage controlled oscillator in accordance with the digital output received thereby when the digital output indicates that the phase difference between the reference signal and the divided feedback signal is greater than a predetermined phase difference;
    wherein said voltage controlled oscillator outputs the output signal in response to both the control voltage signal from said filter and the control signal from said controller.

3. The phase locked loop as claimed in claim 1, wherein:
    when the digital output received by said variable frequency divider indicates that the divided feedback signal lags the reference signal, said variable frequency divider is operable to decrease the value of the variable divisor; and
    when the digital output received by said variable frequency divider indicates that the divided feedback signal leads the reference signal, said variable frequency divider is operable to increase the value of the variable divisor.

4. The phase locked loop as claimed in claim 3, wherein said variable frequency divider includes a programmable frequency divider associated with an initial divisor value that is decreased or increased in accordance with the digital output received thereby.

5. The phase locked loop as claimed in claim 3, wherein said variable frequency divider includes a multi-mode frequency divider.

6. The phase locked loop as claimed in claim 5, wherein said multi-mode frequency divider includes:
    a X/Y frequency dividing circuit for performing frequency division on the output signal by one of X and Y, where X and Y are distinct positive integers;
    a counter coupled to said X/Y frequency dividing circuit for counting a number (P) of division operations of said X/Y frequency dividing circuit that includes a number (S) of division operations by X and a number (P−S) of division operations by Y, and outputting a transition control signal to said X/Y frequency dividing circuit such that said X/Y frequency dividing circuit operates based on the transition control signal; and
    a shift register coupled to said phase error comparator, said counter and said X/Y frequency dividing circuit, receiving the digital output from said phase error comparator, and operable so as to shift the transition control signal from said counter in accordance with the digital output received thereby when the digital output indicates that the phase difference between the reference signal and the divided feedback signal is greater than a predetermined phase difference such that the number (S) of division operations by X within the number (P) of division operations is adjusted according to the digital output.

7. The phase locked loop as claimed in claim 6, wherein X is equal to 4 and Y is equal to 5.

8. The phase locked loop as claimed in claim 1, wherein the digital output outputted by said phase error comparator includes:
    a first signal indicating whether the divided feedback signal lags or leads the reference signal, the first signal having a low level when the divided feedback signal lags the reference signal, and a high level when the divided feedback signal leads the reference signal; and
    a second signal indicative of the phase difference between the divided feedback signal and the reference signal.

9. The phase locked loop as claimed in claim 8, wherein:
    the phase detecting output includes a first pulse signal corresponding to the reference signal, and a second pulse signal corresponding to the divided feedback signal, a phase difference between the first and second pulse signals corresponding to the phase difference between the divided feedback signal and the reference signal;
    the second signal of the digital output is a multi-bit signal having a number (K) of bit components; and
    said phase error comparator includes
        a first D-type flip-flop having a clock input and a data input coupled to said phase/frequency detector for receiving respectively the first and second pulse signals therefrom, and a data output for outputting the first signal of the digital output, an OR gate having two input ends coupled to said phase/frequency detector for receiving respectively the first and second pulse signals therefrom, and an output end, an AND gate having two input ends coupled to said phase/frequency detector for receiving respectively the first and second pulse signals therefrom, and an output end, a series connection of a number (K) of delay circuits each having an input and an output, each of said delay circuits being capable of receiving an input signal through said input thereof, and subsequently outputting the input signal received thereby through said output thereof after a predetermined time delay, said input of a first one of said delay circuits being coupled to said output end of said OR gate, and a number (K) of second D-type flip-flops each having a clock input coupled to said output end of said AND gate, a data input, and a data output, said data input of a $j^{th}$ one of said second D-type flip-flops being coupled to said output of a $j^{th}$ one of said delay circuits, said data output of the $j^{th}$ one of said second D-type flip-flops outputting a $j^{th}$ one of the bit components of the second signal of the digital output, where $1 \leq j \leq K$, wherein, when the phase difference between the divided feedback signal and the reference signal is less than the predetermined time delay, each of the bit components of the second signal of the digital output has a low level, when the phase difference between the divided feedback signal and the reference signal is within a range from r times the predetermined time delay to (r+1) times the predetermined time delay, first to $r^{th}$ ones of the bit components of the second signal of the digital output have a high level and remaining ones of the bit components of the second signal of the digital output have a low level, where $1 \leq r \leq K-1$, and when the phase difference between the divided feedback signal and the reference signal is greater than K times the predetermined time delay, each of the bit components of the second signal of the digital output has a high level.

10. The phase locked loop as claimed in claim 9, wherein K is equal to 3.

11. The phase locked loop as claimed in claim 1, further comprising an auxiliary charge pump coupled to said phase error comparator and said filter, receiving the digital output from said phase error comparator, and outputting an auxiliary current signal to said filter in accordance with the digital output received thereby, wherein said filter outputs the control voltage signal in response to the current signal from said charge pump and the auxiliary current signal from said auxiliary charge pump.

12. The phase locked loop as claimed in claim 11, wherein:

said filter includes a filtering circuit including a series connection of a resistor and a first capacitor coupled to said charge pump and said voltage controlled oscillator, and a second capacitor coupled in parallel to the series connection of said resistor and said first capacitor; and said auxiliary charge pump supplies a charging current that serves as the auxiliary current signal to said first capacitor of said filtering circuit of said filter when the digital output indicates that the divided feedback signal lags the reference signal, and provides a discharge path for permitting discharge of said first capacitor of said filtering circuit of said filter with a discharge current that serves as the auxiliary current signal therethrough when the digital output indicates that the divided feedback signal leads the reference signal, the auxiliary current signal having a current value corresponding to the phase difference between the divided feedback signal and the reference signal.

13. The phase locked loop as claimed in claim 12, wherein:

said filter further includes a bypass switch coupled across said resistors and having a control end for receiving a control signal such that said bypass switch is triggered to conduct in response to the control signal received thereby so as to bypass said resistor; and said phase error comparator outputs the control signal to said control end of said bypass switch upon detecting that the phase difference between the divided feedback signal and the reference signal is greater than a predetermined phase difference.

14. The phase locked loop as claimed in claim 1, wherein:

said filter includes a filtering circuit including a series connection of a resistor and a first capacitor coupled to said charge pump and said voltage controlled oscillator, a second capacitor coupled in parallel to the series connection of said resistor and said first capacitor, and a bypass switch coupled across said resistor and having a control end for receiving a control signal such that said bypass switch is triggered to conduct in response to the control signal received thereby so as to bypass said resistor; and said phase error comparator outputs the control signal to said control end of said bypass switch upon detecting that the phase difference between the divided feedback signal and the reference signal is greater than a predetermined phase difference.

* * * * *